United States Patent
Shmulovich

Patent Number: 5,126,007
Date of Patent: Jun. 30, 1992

[54] METHOD FOR ETCHING A PATTERN IN LAYER OF GOLD

[75] Inventor: Joseph Shmulovich, New Providence, N.J.

[73] Assignee: AT&T Bell Laboratories, Murray Hill, N.J.

[21] Appl. No.: 614,785

[22] Filed: Nov. 16, 1990

[51] Int. Cl.$^5$ ............................................. H01L 21/00
[52] U.S. Cl. .................................. 156/643; 156/646; 156/664; 156/659.1
[58] Field of Search ............. 156/643, 646, 664, 659.1

[56] References Cited

U.S. PATENT DOCUMENTS

| | | | |
|---|---|---|---|
| 3,900,944 | 8/1975 | Fuller et al. | 156/654 |
| 3,975,252 | 8/1976 | Fraser et al. | 156/656 |
| 4,033,027 | 7/1977 | Fair et al. | 437/233 |
| 4,650,543 | 3/1987 | Kishita et al. | 156/643 |
| 4,673,958 | 6/1987 | Bayraktaroglu | 357/13 |

FOREIGN PATENT DOCUMENTS 63-030270  7/1988  Japan .

*Primary Examiner*—David A. Simmons
*Assistant Examiner*—George A. Goudreau
*Attorney, Agent, or Firm*—Glen E. Books

[57] ABSTRACT

The present applicant has discovered that gold can be patterned by masking and reactively ion etching in a $CF_4/O_2$ plasma. In accordance with the invention, a layer of gold is patterned by the steps of a) forming a layer of gold on a substrate, b) masking the gold layer to selectively expose a pattern to be etched, c) exposing the masked layer to a $CF_4/O_2$ plasma. In preferred practice, the substrate comprises a gallium arsenide substrate having an interface layer comprising titanium to promote adhesion of the gold layer, and the gold layer is formed by sputtering onto the interface layer. The gold layer is masked by photoresist, and the masked layer is exposed to a $CF_4/O_2$ plasma with the molar percent of $O_2$ in excess of about 8%. Advantageously, the exposed intermediate layer can be plasma etched away.

8 Claims, 1 Drawing Sheet

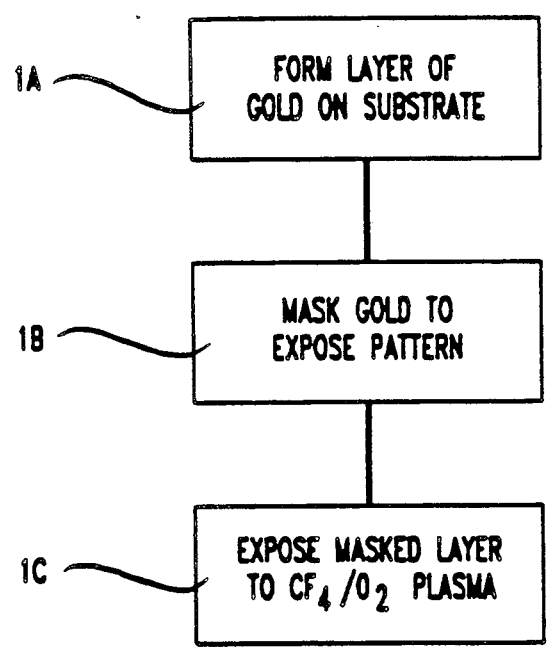

METHOD FOR ETCHING A PATTERN IN LAYER OF GOLD

FIELD OF THE INVENTION

This invention relates to a method for etching gold and, more particularly, to a method for etching a pattern in a gold layer on a semiconductor substrate, such as gallium arsenide, without incurring the disadvantages of the conventional lift-off process.

BACKGROUND OF THE INVENTION

Because gold is chemically inactive to most common reagents, gold is difficult to pattern. As a consequence direct etching of gold, requiring harsh reagents such as aqua regia, is not practical when gold is to be patterned on substrates reactive to the gold etchant. Thus, for example, in the fabrication of gold interconnects on semiconductor substrates it is common practice to pattern the gold by a lift off process rather than by direct etching.

In a typical lift off process, a protective layer of material such as photoresist is formed on the substrate in an inverse of the desired pattern. The photoresist is applied over the surface of the substrate and is patterned by photolithography so all portions of the substrate surface not to be covered with gold are covered with photoresist. An intermediate layer to promote adhesion, such as titanium, is applied to the substrate. A layer of gold is then applied over the titanium, and the underlying photoresist is dissolved away. The composite metal layer lifts off the areas where the titanium contacts only photoresist but remains where it contacts the substrate.

While the lift off process permits patterning of gold without the use of harsh etchants, the process has serious limitations in the fabrication of integrated circuit devices. The lift off process presents adhesion problems due to residual polymeric material from the photoresist. The intermediate layer is typically applied to a substrate surface containing residual polymeric material, weakening its adhesion to the substrate. In addition, the tearing off of the metal produces irregularities around the periphery of the gold pattern. Accordingly, there is need for an improved process for patterning gold.

SUMMARY OF THE INVENTION

The present applicant has discovered that gold can be patterned by masking and reactively ion etching in a $CF_4/O_2$ plasma. The discovery is surprising because to applicant's knowledge, gold does not have volatile reaction products with the constituents of these gates.

In accordance with the invention, a layer of gold is patterned by the steps of a) forming a layer of gold on a substrate, b) masking the gold layer to selectively expose a pattern to be etched, c) exposing the masked layer to a $CF_4/O_2$ plasma. In preferred practice, the substrate comprises a gallium arsenide substrate having an interface layer comprising titanium to promote adhesion, and the gold layer is formed by sputtering onto the titanium interface layer. The gold layer is masked by photoresist, and the masked layer is exposed to a $CF_4/O_2$ plasma with the molar percent of $O_2$ in excess of about 8%. Advantageously, the exposed intermediate layer can be plasma etched away.

BRIEF DESCRIPTION OF THE DRAWING

The advantages, nature and various additional features of the invention will appear more fully upon consideration of the illustrative embodiment now to be described in detail in connection with FIG. 1 which is a flow diagram of a preferred method for patterning a gold layer in accordance with the invention.

DETAILED DESCRIPTION

Referring to the drawing, FIG. 1 illustrates the steps in patterning a gold layer in accordance with the invention. FIG. 1A shows the first step which involves forming a layer of gold on a substrate. Preferably the substrate is a semiconductor substrate such as gallium arsenide; and, as a preliminary step, the substrate is provided with an interface layer, such as titanium, to promote adhesion of the gold layer.

Specifically, a gold layer can be formed by placing a gallium arsenide wafer in a multisource sputtering chamber, such as an MRC 903A marketed by Materials Research Corporation, Orangeburg, N.Y. The wafer has been thoroughly cleaned in standard preparation for metalization. The chamber is preferably provided with three sputtering targets: titanium, tungsten, and gold. The loaded chamber is evacuated to a pressure of about $10^{-6}$ torr and backfilled with an inert gas such as argon to a pressure of about $10^{-2}$ torr. The interface layer is then formed by sputtering a layer of titanium (about 500 Å). Optionally, a barrier layer can be applied over the titanium by sputtering a layer of tungsten (about 1000 Å). A layer of gold is then formed by sputtering gold onto the workpiece. For typical integrated circuit applications the gold layer preferably has a thickness in the range from 100 angstroms to about ten thousand angstroms. Alternatively, the gold layer can be formed in a different chamber by vacuum evaporation.

The next step shown in FIG. 1B is masking the gold layer to selectively expose a pattern to be etched. The gold-layered substrate is removed from the sputtering chamber, and masking of the areas not to be etched is carried out using photoresist and conventional photolithographic techniques of exposure and development. A preferred photoresist is Shipley AZ 1400-31.

The masked gold layer is then exposed to a $CF_4/O_2$ plasma. After masking, the workpiece is placed in an etching chamber, such as an LFE Model PSS/PDE/PDS-501, marketed by LFE Corporation, Waltham, Mass. The gold layer is preferably p reheated to a temperature in the range 50° C.-120° C. The chamber is evacuated to a pressure of about $10^{-3}$ torr, and backfilled with a mixture of $CF_4$ and $O_2$ at a pressure of 200 to 1000 millitor. Preferably the molar percent of $O_2$ exceeds about 8% and is advantageously about 18%. A $CF_4/O_2$ plasma is generated by applying RF power to a plasma generator at a frequency of 13.6 MHz and at a level of up to 400 watts.

The effect of gas composition on etch rate was shown in three experiments using $CF_4$ with 18% $O_2$, 8% $O_2$ and 0° $O_2$. For the 18% $O_2$ mixture at 300 millitor and 150 watts, the etch rate was 470 angstroms per minute. For 8% $O_2$ under the same conditions, the etch rate was 86 angstroms per minute. And with no $O_2$, there was no observable etching of the gold.

Using the 18% $O_2$ mixture and varying the pressure, a lower etch rate of 300 angstroms per minute was observed at 500 millitor, but a higher etch rate of 837 angstroms per minutes was observed at 800 millitor.

After the exposed gold is etched away, the underlying exposed intermediate layer can also be conveniently etched away in the same chamber in a plasma comprising $CF_4$.

After etching away the exposed gold and underlying intermediate layer, the photoresist mask is removed in the usual fashion, as by ashing, leaving a precisely formed gold pattern.

The above described method for plasma etching of a gold layer has several advantages over the presently used lift off technique. In essence plasma etching of gold provides better control of the gold geometry and better adhesion. The gold geometry is better controlled because the gold peripheries are precisely defined without lift off irregularities. There is better adhesion of gold to the substrate because the intermediate layer can be deposited on a clean surface free of polymeric residues in a chamber uncontaminated with polymeric residues.

It is to be understood that the above-described embodiments are illustrative of only a few of the many possible specific embodiments which can represent applications of the principles of the invention. For example, while the invention is particularly useful in etching gold on gallium arsenide substrates, it can also be used to etch gold on other substrates such as silicon, ceramics, glass or metal. Thus numerous and varied other arrangements can be devised in accordance with these principles without departing from the spirit and scope of the invention.

I claim:

1. A method for etching a pattern in a gold layer comprising the steps of:
   forming a layer of gold on the substrate;
   masking the gold layer with photoresist to selectively expose gold in a pattern to be etched; and
   etching away the exposed gold by reactive ion etching in a $CF_4/O_2$ plasma.

2. The method of claim 1 wherein said gold layer is formed on a substrate composing a semiconductor material and said gold layer is formed in a thickness in the range between 100 and 10,000 angstroms.

3. The method of claim 2 wherein said exposed gold is etched by exposing said gold to a plasma formed in a mixture comprising $CF_4$ and at least 8 molar percent of $O_2$.

4. The method of claim 1 wherein:
   said gold layer is formed on a substrate composing gallium arsenide,
   said gold layer is formed in a thickness in the range between 100 and 10,000 angstroms,
   and said masked layer is exposed to a plasma formed in a mixture comprising $CF_4$ and at least 8 molar percent of $O_2$.

5. The method of claim 4 wherein said gold layer is formed on a substrate comprising a semiconductor material having thereon an intermediate metal layer to facilitate adhesion of the gold layer to the substrate surface.

6. The method of claim 5 wherein said semiconductor material is gallium arsenide and said intermediate metal layer comprises titanium.

7. The method of claim 5 wherein said intermediate metal layer is deposited on a substrate surface essentially free of photoresist residues.

8. The method of claim 5 including the additional step of plasma etching away the portions of said intermediate layer exposed by the etching away of said exposed gold.

* * * * *